Figure 1:
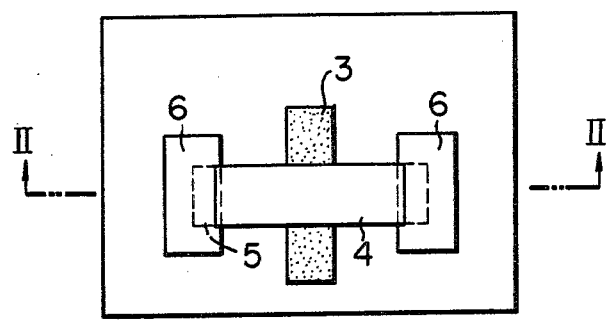

United States Patent [19]

Nate et al.

[11] 4,208,005
[45] Jun. 17, 1980

[54] METHOD FOR MOUNTING PARTS ON CIRCUIT BOARDS

[75] Inventors: Kazuo Nate, Machida; Kyoko Kotsuka; Tokio Isogai, both of Fujisawa, all of Japan

[73] Assignee: Hitachi, Ltd., Tokyo, Japan

[21] Appl. No.: 10,026

[22] Filed: Feb. 6, 1979

[30] Foreign Application Priority Data

Feb. 8, 1978 [JP] Japan .................................. 53-12400

[51] Int. Cl.² .............................................. H05K 3/34
[52] U.S. Cl. ............................... 228/175; 228/179;
228/180 R; 427/44; 427/96; 29/834; 29/840;
156/275; 156/281
[58] Field of Search ..................... 29/626; 427/96, 44;
228/179, 180 R, 175

[56] References Cited

U.S. PATENT DOCUMENTS

| | | | |
|---|---|---|---|
| 3,704,515 | 12/1972 | Nelson | 29/626 |
| 3,859,722 | 1/1975 | Kinsky et al. | 29/626 |
| 4,064,287 | 12/1977 | Lipson et al. | 427/96 |
| 4,074,008 | 2/1978 | Green | 427/96 |
| 4,139,881 | 2/1979 | Shimizu et al. | 228/180 R |
| 4,141,055 | 2/1979 | Berry et al. | 427/96 |

OTHER PUBLICATIONS

National Technical Report, vol. 24, No. 1, pp. 120-126, 2-1978.

*Primary Examiner*—John D. Smith
*Attorney, Agent, or Firm*—Craig & Antonelli

[57] ABSTRACT

One or more parts having terminals can be mounted on a circuit board by coating an ultraviolet-curing and thermosetting resin composition comprising an ultraviolet-curing resin, an addition polymerizable monomer, a photosensitizer and a heat polymerization initiator, on the circuit board by screen printing with a prescribed pattern, mounting the parts on the printed resin composition, curing the resin composition by simultaneous irradiation of ultraviolet light and heat rays so as to bond the parts to the circuit board, and soldering the parts onto the circuit board.

11 Claims, 2 Drawing Figures

METHOD FOR MOUNTING PARTS ON CIRCUIT BOARDS

This invention relates to a method for mounting parts on circuit boards such as printed wiring boards, hybrid integrated circuits and the like.

Heretofore, in the case of mounting parts such as laminated chip capacitors, laminated chip resistors, etc. on circuit boards such as printed wiring boards, hybrid integrated circuits and the like, these parts initially have been bonded to the boards with thermosetting adhesives, and subsequently soldered by passing the parts and associated boards through a tank of molten solder. As the thermosetting adhesives, epoxy resins and the like have been used for bonding the parts by heating, for example, at 120° C. for 20 minutes. The adhesives have usually been coated on the parts or areas on the circuit boards on which the parts are to be mounted with a brush, etc. But the above-mentioned method had various disadvantages in that since the thermosetting adhesives required a long period of curing with heating, it was difficult to work continuously, properties of the parts were changed by heating, inferior curing of the adhesives occurred due to variability of curing temperatures, and the like. In addition, the method of coating adhesives by brushing had another disadvantage in that it was difficult to coat the adhesives under a constant pattern, which resulted in inferior soldering.

In order to overcome the disadvantages mentioned above, ultraviolet-curing resins and electron radiation-curing resins have been studied. Particularly, since ultraviolet-curing resins not only contribute to the realization of the production but also can be produced by using inexpensive production facilities, extensive studies on practical uses of these resins in various fields have been made (e.g. National Technical Report vol. 24, No. 1, February 1978, pages 120–126). Further, in order to coat an adhesive under a constant pattern, a screen printing technique is mainly employed. But, although the ultraviolet-curing resins are fast-curing, since they do not cure on the portions wherein no ultraviolet light is transmitted, their use as adhesive has been limited narrowly to, for example, glass and the like.

It is an object of this invention to provide a method for mounting parts such as laminated chip capacitors and resistors on circuit boards by using a special ultraviolet-curing and thermosetting resin composition which overcomes the disadvantages of the known methods, and by curing the special resin composition with the use of irradiation of ultraviolet light and heat rays in a very short time. Further objects and advantages of this invention will be apparent to one skilled in the art from the accompanying drawings and the following disclosure.

This invention provides a method for mounting one or more parts having terminals on a circuit board which comprises coating an ultraviolet-curing and thermosetting resin composition on the circuit board by screen printing with a prescribed pattern except for the wiring portions of the circuit board, mounting the parts on the printed resin composition so as to connect the terminals of the parts to the wiring, curing the resin composition by simultaneous irradiation of ultraviolet light and heat rays to bond the parts to the circuit board, and soldering the terminals of the parts onto the wiring of the circuit board.

Figure 2:
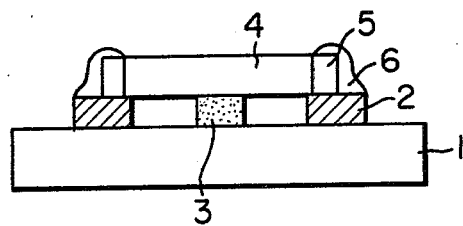

In the attached drawings,

FIG. 1 shows a plan view of a circuit board on which a chip part is mounted according to the method of this invention and FIG. 2 shows a cross-sectional view taken along the line II—II shown in FIG. 1.

According to this invention, opaque chip parts can be bonded to the circuit board within 30 seconds. Further this invention has the following advantages: (1) continuous operation is possible, (2) changes of properties of the elements by heating do not appear, (3) there occurs no failure in adhesion due to a temporary decrease in the viscosity of an adhesive during the curing with heating, (4) there occurs no failure in soldering by dirtying the soldering portions due to a temporary decrease in the viscosity of an adhesive during the curing with heating, (5) the resin composition has a long pot life, and (6) the realization of production procedures is possible.

The ultraviolet-curing and thermosetting resin composition used in this invention comprises:

(a) 100 parts by weight of at least one ultraviolet-curing resin, (b) 5 to 70 parts by weight of at least one addition polymerizable monomer having at least one ethylenically unsaturated group ($CH_2=C<$) and a boiling point of 100° C. or more at atmospheric pressure, (c) 0.05 to 5 parts by weight of at least one photosensitizer, and (d) 0.05 to 5 parts by weight of a heat polymerization initiator.

If necessary, the resin composition may further contain one or more conventional fillers, thixotropic agents, adhesion imparting agents, coloring agents, antioxidants, surface curing accelerating agents and other conventional additives.

Examples of the ultraviolet-curing resin are unsaturated polyesters, unsaturated polyurethanes, epoxy acrylate resins, 1,2-polybutadienes having a molecular weight of 500 to 10,000 and having acryloyl, acryloyloxy, methacryloyl, or methacryloyloxy groups at terminals, and polyorganosiloxanes having a molecular weight of 500 to 10,000 and having acryloyl, acryloyloxy, methacryloyl or methacryloyloxy groups at terminals.

The molecular weight of the 1,2-polybutadienes having acryloyl, acryloyloxy, methacryloyl, or methacryloyloxy groups at terminals or the polyorganosiloxanes having acryloyl, acyloyloxy, methacryloyl or methacryloyloxy groups at terminals should be 500 to 10,000. If the molecular weight is smaller than 500, mechanical properties of the cured resin composition are lowered too much to be practically used, and if more than 10,000, the viscosity of the resin composition becomes too high, so that printing properties of the highly viscous resin composition are lowered too much to be practically used.

The addition polymerizable monomer having at least one ethylenically unsaturated group ($CH_2=C<$) should have a boiling point of 100° C. or more at atmospheric pressure. If the boiling point is less than 100° C., evaporation at the ultraviolet curing increases, which is not preferable from the viewpoint of safety. Examples of the addition polymerizable monomers are styrene derivatives such as styrene, vinyltoluene, etc.; acrylate compounds such as acrylic acid, butyl acrylate, 2-hydroxyethyl acrylate, 2-hydroxypropyl acrylate, lauryl acrylate, etc.; methacrylate compounds such as methacrylic acid, ethyl methacrylate, lauryl methacrylate, 2-hydroxypropyl methacrylate, 2-hydroxyethyl methacrylate, etc.; polyfunctional acrylic or methacrylic esters having two or more unsaturated groups such as 1,6-hexanediol diacrylate, ethylene glycol dimethacrylate, trimethylolpropane trimethacrylate, polyethylene glycol dimethacrylate, 1,4-butanediol dimethacrylate, etc.; polyfunctional vinyl monomers such as diallyl phthalate, divinyl benzene, etc.

These monomers are effectively used in an amount of 5 to 70 parts by weight per 100 parts by weight of the ultraviolet-curing resin. If the amount is less than 5 parts by weight, mechanical strength of the cured coating film is lowered unfavorably from the viewpoint of practical use and ultraviolet curing reaction rate is lowered unfavorably. If the amount is more than 70 parts by weight, mechanical properties and heat resistance of the cured coating film are lowered unfavorably. These monomers can be used alone or as a mixture of two or more of them.

As the photosensitizer, there can be used benzoin and its derivatives such as 4,4'-dimethyl benzoin; benzoin ethers such as benzoin methyl ether, benzoin ethyl ether, benzoin isopropyl ether, etc.; benzil and its derivatives such as 4,4'-dimethyl benzil, etc.; aryl diazonium salts such as benzene diazonium chloride, etc.; anthraquinone and its derivatives such as 2-methylanthraquinone, 2-t-butylanthraquinone, 2-chloroanthraquinone, etc.; acetophenone and its derivatives such as 4-methoxyacetophenone, etc.; sulfur compounds such as diphenyl disulfide, diethyl disulfide, etc.; benzophenone and its derivatives such as 4-methoxybenzophenone, etc. These photosensitizers can be used alone or as a mixture of two or more of them.

The photosensitizer is effectively used in an amount of 0.05 to 5 parts by weight per 100 parts by weight of the ultraviolet-curing resin. If the amount is less than 0.05 part by weight, the ultraviolet curing reaction rate of the ultraviolet-curing resin is lowered and excellent moisture resistance and mechanical properties of the cured coating film cannot be obtained. If the amount is more than 5 parts by weight, no cured material having a high molecular weight can be obtained and moisture resistance of the cured coating film is remarkably lowered unfavorably. In each case, the resulting circuit board cannot be used practically. A more effective amount of the photosensitizer is 0.3 to 2 parts by weight per 100 parts by weight of the ultravioletcuring resin.

As the heat polymerization initiator, there can be used organic peroxides such as benzoyl peroxide, acetyl peroxide, lauroyl peroxide, 1,1-bis(t-butylperoxy)-3,3,5-trimethylcyclohexane, etc., conventional radical polymerization initiators such as azo compounds, e.g. azobisisobutyronitrile, 2,2'-azobis-2-methylbutyronitrile, 2,2'-azobis(methyl isobutyrate), etc. The heat polymerization initiator is used effectively in an amount of 0.05 to 5 parts by weight per 100 parts by weight of the ultraviolet-curing resin. If the amount is less than 0.05 part by weight, the heat polymerization rate of the ultraviolet-curing and thermosetting resin composition becomes slow and a cured coating film having excellent moisture resistance and mechanical properties can not be obtained. If the amount is more than 5 parts by weight, a cured material having high molecular weight can not be obtained and moisture resistance of the cured coating film is remarkably lowered unfavorably. In each case, the resulting circuit board cannot be used practically. A more effective amount of the heat polymerization initiator is 0.3 to 3 parts by weight per 100 parts by weight of the ultraviolet-curing resin.

As the filler, there can be used powders of aluminum oxide, silicon dioxide, calcium carbonate, titanium dioxide, barium sulfate, mica, etc. The filler can preferably be used in an amount of 300 parts by weight or less, preferably 50 to 200 parts by weight per 100 parts by weight of the ultraviolet-curing resin.

As the thixotropic agent, there can preferably be used pulverized silicon dioxide having a specific surface area of 100–450 $m^2/g$ in an amount of 10 parts by weight or less, preferably 5 to 7 parts by weight per 100 parts by weight of the ultraviolet-curing resin.

As the coloring agent, there can be used pigments and dyes conventionally used such as phthalocyanine blue, phthalocyanine green, etc.

As the antioxidant, there can preferably be used conventional heat polymerization inhibitors such as hydroquinone, hydroquinone methyl ether, catechol, 2,6-di-t-butyl-4-methylphenol, etc.

As the adhesion imparting agent, there can preferably be used silane coupling agents such as $\gamma$-methacryloyloxypropyltrimethoxysilane, vinyltris($\beta$-methoxyethoxy)silane, etc., in an amount of 0.1 to 10 parts by weight per 100 parts by weight of the ultraviolet-curing resin.

As the surface curing accelerating agent, there can preferably be used metal salts of organic acids such as cobalt naphthenate, manganese octoate, etc.

The coating of the ultraviolet-curing and thermosetting resin composition on the circuit board on which parts are to be mounted is conducted by screen printing to give a coating film having a prescribed pattern. As the screen printing technique, a conventional one can be used. Other methods such as the brushing method are not preferable for giving a constant pattern continuously.

After mounting parts on the printed resin composition, the resin composition is cured by simultaneous irradiation of ultraviolet light and heat rays to bond the parts on the circuit board in a very short time, e.g. within 30 seconds.

As the source of ultraviolet light and heat rays, there can be used high-pressure mercury lamps, ultrahigh-pressure mercury lamps, metal halide lamps, carbon arc lamps, xenon lamps, etc. These lamps can be used alone or in combination, or together with an infrared lamp.

After bonding of the parts by simultaneous irradiation of ultraviolet light and heat rays, the bonded parts are soldered by using a conventional soldering technique.

This invention is illustrated more particularly by way of the following examples, in which all parts are given as parts by weight unless otherwise specified.

EXAMPLE 1

A resin composition was prepared by mixing uniformly 100 parts of 1,2-polybutadiene having terminal methacryloyloxy groups and a molecular weight of about 2000, 15 parts of ethylene glycol dimethacrylate, 15 parts of trimethylolpropane trimethacrylate, 2 parts of 2-methylanthraquinone, 5 parts of pulverized silicon dioxide having a specific surface area of 380 $m^2/g$, 50 parts of $\alpha$-alumina particles having an average particle size of 1 $\mu m$, 3 parts of $\gamma$-methacryloyloxypropyltrimethoxysilane, and 3 parts of benzoyl peroxide with stirring. The resin composition was coated on a printed circuit board 1 as shown in FIGS. 1 and 2 by using a usual screen printing machine to form an adhesive layer 3 of about 50 $\mu m$ thick between connecting terminals 2. Subsequently, a laminated chip capacitor 4 was mounted thereon and irradiated with a 80 W/cm metal halide lamp (iron chloride) (total consuming electric power 2 kW) at a distance of 15 cm for about 20 seconds so as to cure the adhesive layer 3. Subsequently, the resulting printed circuit board was dipped in a molten solder tank heated at 240°±10° C. for 10 seconds in order to solder electrode portions 5 of the laminated chip capacitor 4 with the connecting terminals 2 using solder 6. During the soldering, the laminated chip capacitor 4 did not peel off from the printed circuit board 1 and the soldering properties were better.

EXAMPLE 2

A resin composition was prepared by mixing uniformly with stirring 100 parts of the same 1,2-polybutadiene as used in Example 1, 30 parts of 2-hydroxyethyl methacrylate, 10 parts of ethylene glycol dimethacryalte, 1 part of 2-methylanthraquinone, 5 parts of pulverized silicon dioxide having a specific surface area of 380 m$^2$/g, 50 parts of α-alumina particles having an average particle size of 1 μm, 3 parts of γ-methacryloyloxypropyltrimethoxysilane and 3 parts of benzoyl peroxide. By using the resin composition, the same sample as used in Example 1 as shown in FIGS. 1 and 2 was produced. The sample was irradiated with a 80 W/cm metal halide lamp (total consuming electric power 2 kW) at a distance of 15 cm for about 30 seconds so as to cure the adhesive layer. Subsequently, the resulting printed circuit board was dipped in a molten solder tank heated at 240°±10° C. five times for 10 seconds for each time. The chip element did not peel off from the printed circuit board and the adhesion properties were better.

EXAMPLE 3

A resin composition was prepared by mixing uniformly with stirring 100 parts of polyorganosiloxane having terminal methacryloyloxy groups and a molecular weight of about 3000, 30 parts of 2-hydroxypropyl methacrylate, 10 parts of lauryl methacrylate, 1 part of benzophenone, 7 parts of pulverized silicon dioxide having a specific surface area of 380 m$^2$/g, 100 parts of silica powder having a particle size of 1 μm, 3 parts of vinyltris(β-methoxyethoxy)silane and 3 parts of 1,1-bis(t-butylperoxy)-3,3,5-trimethylcyclohexane. By using the resin composition, a glass molding diode was mounted on a printed circuit board in the same manner as described in Example 1. The resulting circuit board was irradiated with a 80 W/cm high-pressure mercury lamp (total consuming electric power 2 kW) at a distance of 20 cm for about 30 seconds to cure the adhesive layer. Subsequently, the resulting printed circuit board was dipped in a molten solder tank heated at 260°±10° C. for 5 seconds to effect soldering. The dipping procedure was repeated five times without causing the peeling of the glass molding diode from the printed circuit board. The adhesion properties and soldering properties were better.

EXAMPLE 4

A resin composition was prepared by mixing uniformly with stirring 100 parts of the same 1,2-polybutadiene as used in Example 1, 30 parts of 2-hydroxypropyl methacrylate, 40 parts of ethylene glycol dimethacrylate, 5 parts of 2-t-butylanthraquinone, 5 parts of pulverized silicon dioxide having a specific surface area of 380 m$^2$/g, 200 parts of α-alumina powder having an average particle size of 1 μm, 3 parts of γ-methacryloyloxypropyltrimethoxysilane and 5 parts of benzoyl peroxide. By using the resin composition, a laminated chip capacitor, a chip resistor, a glass molding diode and a transistor were mounted on a printed circuit board in the same manner as described in Example 1. The resulting circuit board was irradiated with a 80 W/cm metal halide lamp (total consuming electric power 2 kW) at a distance of 15 cm for about 20 seconds to cure the adhesive layer. Subsequently, the resulting printed circuit board was dipped in a molten solder tank heated at 240°±10° C. for 10 seconds to effect soldering. The dipping procedure was repeated five times without causing the peeling of the chip elements from the printed circuit board. No change was observed after washing with a solvent such as 1,1,1-trichloroethane and the adhesion properties and soldering properties were better.

EXAMPLE 5

A resin composition was prepared by mixing uniformly with stirring 100 parts of epoxy acrylate resin having terminal methacryloyloxy groups and a molecular weight of about 500, 5 parts by weight of 2-hydroxyethyl methacrylate, 0.05 part of 2-methylanthraquinone, 5 parts of pulverized silicon dioxide powder having a specific surface area of 380 m$^2$/g, 3 parts of γ-methacryloyloxypropyltrimethoxysilane and 0.05 part of benzoyl peroxide. By using the resin composition, the same sample as shown in Example 1 was produced. The sample was irradiated with a 80 W/cm metal halide lamp (total consuming electric power 2 kW) at a distance of 15 cm for about 30 seconds so as to cure the adhesive layer. Subsequently, the resulting printed circuit board was dipped in a molten solder tank heated at 240°±10° C. for 10 seconds without causing the peeling of the chip element from the printed circuit board. The adhesion properties were better.

EXAMPLE 6

A resin composition was prepared by mixing uniformly with stirring 100 parts of the same 1,2-polybutadiene as used in Example 1, 30 parts of 2-hydroxyethyl methacrylate, 10 parts of ethylene glycol dimethacrylate, 1 part of 2-methylanthraquinone and 3 parts of benzoyl peroxide. By using the resin composition, the same sample as used in Example 1 as shown in FIGS. 1 and 2 was produced. The sample was irradiated with a 80 W/cm metal halide lamp (total consuming electric power 2 kW) at a distance of 15 cm for about 30 seconds so as to cure the adhesive layer. Subsequently, the resulting printed circuit board was dipped in a molten solder tank heated at 240°±10° C. five times for 10 seconds each time without causing the peeling of the chip element from the printed circuit board. The adhesion properties were excellent.

COMPARATIVE EXAMPLE 1

To 100 parts of the same 1,2-polybutadiene as used in Example 1, 3 parts of ethylene glycol dimethacrylate, 2 parts of 2-methylanthraquinone, 5 parts of pulverized silicon dioxide having a specific surface area of 380 m$^2$/g, 3 parts of γ-methacryloyloxypropyltrimethoxysilane and 3 parts of benzoyl peroxide were added and stirred to give a uniformly mixed resin composition. But since the viscosity of the resin composition was so high the resin composition could not be coated on a printed circuit board. Since the workability was poor, the resin composition could not be applied to practical use.

COMPARATIVE EXAMPLE 2

To 100 parts of the same 1,2-polybutadiene as used in Example 1, 30 parts of ethylene glycol dimethacrylate, 2 parts of 2-methylanthraquinone, 5 parts of pulverized silicon dioxide having a specific surface area of 380 m$^2$/g and 3 parts of γ-methacyloyloxypropyltrimethoxysilane were added with stirring to give a uniform resin composition. By using this resin composition, a laminated chip capacitor was mounted on a printed circuit board in the same manner as described in Example 1. The resulting circuit board was irradiated with a 80 W/cm metal halide lamp (total consuming electric power 2 kW) at a distance of 15 cm for 30 seconds so as to cure the adhesive layer. Subsequently, the resulting circuit board was dipped in a molten solder tank heated at 240°±10° C. for 10 seconds to effect soldering. About 10% of the chip element was peeled off from the printed circuit board and the adhesion properties were not good. Therefore, the resulting printed circuit board mounting the chip element could not be applied to practical use.

COMPARATIVE EXAMPLE 3

Using a conventionally used thermosetting adhesive composition containing 100 parts of bisphenol A type epoxy resin (epoxy equivalent 500, Epon 828, manufactured by Shell Chemical Corp.) and 75 parts of a polyamide resin (amine value 390, Versamide 140, manufactured by General Chem. Co.), a laminated chip capacitor was mounted on a printed circuit board as shown in FIGS. 1 and 2 by allowing the chip element to stand at 100° C. for 30 minutes to bond tentatively. Subsequently, the printed circuit board was dipped in a molten solder tank heated at 240°±10° C. for 10 seconds to conduct soldering. During the soldering, the laminated chip capacitor was not peeled off from the substrate printed circuit board. But, since the pot life of the adhesive composition was as short as about several to several tens minutes and the curing time was as long as several tens minutes, this method was poor in mass producibility and could not be applied to practical use.

What is claimed is:

1. A method for mounting one or more parts having terminals on a circuit board which comprises coating an ultraviolet-curing and thermosetting resin composition on the circuit board by screen printing with a prescribed pattern except for wiring portions of the circuit board, mounting the parts on the printed resin composition, curing the resin composition by simultaneous irradiation of ultraviolet light and heat rays so as to bond the parts to the circuit board, and soldering the terminals of the parts onto the wiring of the circuit board.

2. A method according to claim 1, wherein the ultraviolet-curing and thermosetting resin composition comprises
    (a) 100 parts by weight of at least one ultraviolet-curing resin,
    (b) 5 to 70 parts by weight of at least one addition polymerizable monomer having at least one ethylenically unsaturated group (CH$_2$=C<) and a boiling point of 100° C. or more at atmospheric pressure,
    (c) 0.05 to 5 parts by weight of at least one photosensitizer, and
    (d) 0.05 to 5 parts by weight of a heat polymerization initiator.

3. A method according to claim 2, wherein the ultraviolet-curing resin is an unsaturated polyester, an unsaturated polyurethane, an epoxy acrylate resin, a 1,2-polybutadiene having terminal acryloyl, acryloyloxy, methacryloyl or methacryloyloxy groups and a molecular weight of 500 to 10,000, or a polyorganosiloxane having terminal acryloyl, acryloyloxy, methacryloyl or methacryloyloxy groups and a molecular weight of 500 to 10,000.

4. A method according to claim 2, wherein the addition polymerizable monomer is styrene, a styrene derivative, acrylic acid, a derivative of acrylic acid, methacrylic acid, a derivative of methacrylic acid, a polyfunctional acrylic or methacrylic ester having two or more unsaturated groups, or a polyfunctional vinyl monomer.

5. A method according to claim 2, wherein the photosensitizer is benzoin, a derivative of benzoin, a benzoin ether, benzil, a derivative of benzil, an aryl diazonium salt, anthraquinone, a derivative of anthraquinone, acetophenone, a derivative of acetophenone, diphenyl disulfide, benzophenone or a derivative of benzophenone.

6. A method according to claim 2, wherein the heat polymerization initiator is an organic perioxide or an azo compound.

7. A method according to claim 2, wherein the heat polymerization initiator is benzoyl peroxide, acetyl peroxide, lauroyl peroxide, 1,1-bis(t-butylperoxy)-3,3,5-trimethylcyclohexane, azobisisobutyronitrile, 2,2'-azobis-2-methylbutyronitrile, or 2,2'-azobis(methyl isobutyrate).

8. A method for mounting one or more parts having terminals on a circuit board which comprises coating an ultraviolet-curing and thermosetting resin composition comprising
    (a) 100 parts by weight of at least one ultraviolet-curing resin selected from the group consisting of an unsaturated polyester, an unsaturated polyurethane, an epoxy acrylate resin, a 1,2-polybutadiene having terminal acryloyl, acryloyloxy, methacryloyl or methacryloyloxy groups and a molecular weight of 500 to 10,000, and a polyorganosiloxane having terminal acryloyl, acryloyloxy, methacryloyl or methacryloyloxy groups and a molecular weight of 500 to 10,000,
    (b) 5 to 70 parts by weight of at least one addition polymerizable monomer having at least one ethylenically unsaturated group and a boiling point of 100° C. or more at atmospheric pressure selected from the group consisting of styrene, vinyltoluene, acrylic acid, butyl acrylate, 2-hydroxypropyl acrylate, 2-hydroxyethyl acrylate, lauryl acrylate, methacrylic acid, ethyl methacrylate, lauryl methacrylate, 2-hydroxypropyl methacrylate, 2-hydroxyethyl methacrylate, 1,6-hexanediol diacrylate, ethylene glycol dimethacrylate, trimethylolpropane trimethacrylate, polyethylene glycol dimethacrylate, 1,4-butanediol dimethacrylate, diallyl phthalate and divinyl benzene,
    (c) 0.05 to 5 parts by weight of a photosensitizer selected from the group consisting of benzoin, 4,4'-dimethyl benzoin, benzoin methyl ether, benzoin ethyl ether, benzoin isopropyl ether, benzil, 4,4'-dimethyl benzil, benzene diazonium chloride, anthraquinone, 2-methylanthraquinone, 2-t-butylanthraquinone, 2-chloroanthraquinone, acetophenone, 4-methoxyacetophenone, diphenyl disulfide, diethyl disulfide, benzophenone and 4-methoxybenzophenone,
(d) 0.05 to 5 parts by weight of a heat polymerization initiator selected from the group consisting of benzoyl peroxide, acetyl peroxide, lauroyl peroxide, 1,1-bis(t-butylperoxy)-3,3,5-trimethylcyclohexane, azobisisobutyronitrile, 2,2'-azobis-2-methylbutyronitrile and 2,2'-azobis(methyl isobutyrate), on the circuit board by screen printing with a prescribed pattern except for wiring portions of the circuit board, mounting the parts on the printed resin composition, curing the resin composition by simultaneous irradiation of ultraviolet light and heat rays so as to bond the parts to the circuit board, and soldering the terminals of the parts onto the wiring of the circuit board.

9. A method according to claim 8, wherein the ultraviolet-curing and thermosetting resin composition further comprises 300 parts by weight or less of one or more fillers, 10 parts by weight or less of one or more thixotropic agents and 0.1 to 10 parts by weight of one or more adhesion imparting agents.

10. A method according to claim 1, 8 or 9, wherein ultraviolet light and heat rays are produced by a high-pressure mercury lamp, an ultrahigh-pressure mercury lamp, a metal halide lamp, a carbon arc lamp or a xenon lamp.

11. A method according to claim 9, wherein the filler is a powder of aluminum oxide, silicon dioxide, calcium carbonate, titanium dioxide, barium sulfate or mica, the thixotropic agent is pulverized silicon dioxide having a specific surface area of 100 to 450 $m^2/g$, and the adhesion imparting agent is $\gamma$-methacryloyloxypropyltrimethoxysilane or vinyltris($\beta$-methoxyethoxy)silane.

* * * * *